(12) United States Patent
Kaji et al.

(10) Patent No.: US 8,816,038 B2
(45) Date of Patent: Aug. 26, 2014

(54) AROMATIC ETHER POLYMER, METHOD FOR PRODUCING THE SAME, AND POLYMER COMPOSITION

(75) Inventors: Masashi Kaji, Kitakyushu (JP); Koichiro Ogami, Kitakyushu (JP)

(73) Assignee: Nippon Steel & Sumikin Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/087,602

(22) PCT Filed: Jan. 10, 2007

(86) PCT No.: PCT/JP2007/050129
§ 371 (c)(1),
(2), (4) Date: Jul. 10, 2008

(87) PCT Pub. No.: WO2007/080871
PCT Pub. Date: Jul. 19, 2007

(65) Prior Publication Data
US 2009/0036631 A1    Feb. 5, 2009

(30) Foreign Application Priority Data
Jan. 12, 2006 (JP) ................... 2006-004805

(51) Int. Cl.
*C08G 59/00* (2006.01)
*C08G 8/02* (2006.01)
*C08G 65/38* (2006.01)

(52) U.S. Cl.
USPC ............. 528/87; 528/98; 528/99; 528/125; 528/128; 528/219

(58) Field of Classification Search
CPC ... C08G 65/38; C08G 2650/56; H05K 3/4676
USPC .................. 528/95, 87, 219, 98, 99, 125, 128
See application file for complete search history.

(56) References Cited

U.S. PATENT DOCUMENTS

| 4,845,172 A | 7/1989 | Brytus et al. |
| 5,510,431 A * | 4/1996 | Earls et al. ............. 525/481 |
| 5,866,672 A | 2/1999 | Ohara et al. |

FOREIGN PATENT DOCUMENTS

| EP | 0 305 325 A2 | 3/1989 |
| EP | 0 763 567 A1 | 3/1997 |

(Continued)

OTHER PUBLICATIONS

English machine translation of JP 2003-026769 A, Oshita et al, Jan. 29, 2003.*

(Continued)

*Primary Examiner* — Peter F Godenschwager
*Assistant Examiner* — David Karst
(74) *Attorney, Agent, or Firm* — Birch, Stewart, Kolasch & Birch, LLP

(57) ABSTRACT

Disclosed is a polymer which is useful for the preparation of an epoxy resin composition or a cured product thereof in film or sheet exhibiting high heat resistance, high thermal conductivity, low thermal expansion, high gas barrier property, and high toughness. The polymer is a thermoplastic aromatic ether polymer comprising a unit represented by the following general formula (1) at a ratio of 10 to 100 mol % and having a weight average molecular weight of 3,000 or more;

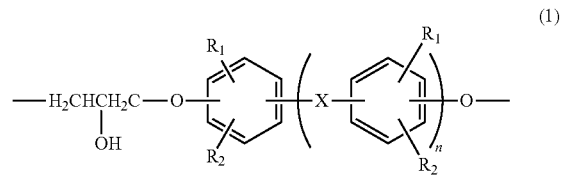

in formula (1), X is an oxygen atom or a sulfur atom, $R_1$ and $R_2$ each is a hydrogen atom, an alkyl group of 1 to 8 carbon atoms, an aryl group, an alkoxy group, an aralkyl group, or a halogen atom, and n is a number of 1 to 3.

9 Claims, 2 Drawing Sheets

(56) References Cited

FOREIGN PATENT DOCUMENTS

| | | | | |
|---|---|---|---|---|
| JP | 64-69620 A | 3/1989 | | |
| JP | 2-45575 A | 2/1990 | | |
| JP | 7-202418 A | 8/1995 | | |
| JP | 9-87498 A | 3/1997 | | |
| JP | 64-69620 A | 3/1999 | | |
| JP | 11-279260 A | 10/1999 | | |
| JP | 2001-26633 A | 1/2001 | | |
| JP | 2003026769 A | * 1/2003 | ............. | C08G 59/40 |
| JP | 2003-183352 A | 7/2003 | | |
| JP | 2003183352 A | * 7/2003 | ............. | C08G 59/22 |
| JP | 2003-252951 A | 9/2003 | | |
| JP | 2003-342350 A | 12/2003 | | |
| JP | 2004346115 A | * 12/2004 | ............. | C08G 59/14 |

OTHER PUBLICATIONS

English machine translation of JP 2004-346115 A, Kaji et al, Dec. 9, 2004.*

Kaji et al., Machine generated English translation of JP 2001-026633 A, Jan. 30, 2001.*

English translation of International Preliminary Report on Patentability, PCT/JP2007/050129, Jul. 24, 2008.

* cited by examiner

AROMATIC ETHER POLYMER, METHOD FOR PRODUCING THE SAME, AND POLYMER COMPOSITION

TECHNICAL FIELD

This invention relates to a novel polymer containing an aromatic ether skeleton, a method for producing said polymer, a composition comprising said polymer, and a cured product obtained by curing said polymer composition.

BACKGROUND TECHNOLOGY

In the production of a cured epoxy resin product in film or sheet, an epoxy resin comprising a high-molecular-weight epoxy resin as an essential ingredient, typically a phenoxy resin, has been used. Phenoxy resins whose main skeleton is constituted of bisphenol A or bisphenol F have been used widely, but they still have problems in heat resistance, thermal expansion property, and thermal conductivity. For example, JP7-202418 A describes a copper foil coated with an adhesive based on a high-molecular-weight epoxy resin of bisphenol A type and multilayer printed wiring boards fabricated therefrom were inferior to the conventional multiplayer printed wiring boards in heat resistance and thermal expansion property.

Patent document 1: JP7-202418 A

Patent document 2: JP2-45575 A

A phenoxy resin prepared from bisphenol A and bisphenol S (that is, 4,4'-dihydroxydiphenyl sulfone) is disclosed in JP2-45575 A as an example of a phenoxy resin showing improved heat resistance. However, this phenoxy resin is higher in viscosity and harder to manipulate as resin than phenoxy resins of a comparable molecular weight and is still not sufficient in heat resistance; besides, it is virtually insoluble in common solvents such as toluene and methyl ethyl ketone, which is a defect as far as handling is concerned. Moreover, the phenoxy resins known thus far are mostly amorphous solid and their properties deteriorate sharply above their glass transition temperatures. Still more, the paint industry has demanded for phenoxy resins further improved in gas barrier property.

DISCLOSURE OF THE INVENTION

Problems to be Solved by the Invention

An object of this invention is to provide an aromatic ether polymer which is useful for the production of a cured epoxy resin product in film or sheet, a method for producing said polymer, a resin composition comprising said polymer, and a cured resin product to be obtained by curing said resin composition.

Means to Solve the Problems

This invention relates to a thermoplastic aromatic ether polymer a unit represented by the following general formula (1) at a concentration of 10 to 100 mol % and having a weight average molecular weight of 3,000 or more;

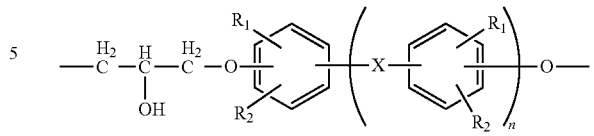

in general formula (1), X is an oxygen atom or a sulfur atom, $R_1$ and $R_2$ each is a hydrogen atom, an alkyl group of 1 to 8 carbon atoms, an aryl group, an alkoxy group, an aralkyl group, or a halogen atom, and n is a number of 1 to 3.

The aromatic ether polymer of this invention can be obtained advantageously by one of the following methods.

1) A method which comprises reacting a diglycidyl compound represented by the following general formula (2)

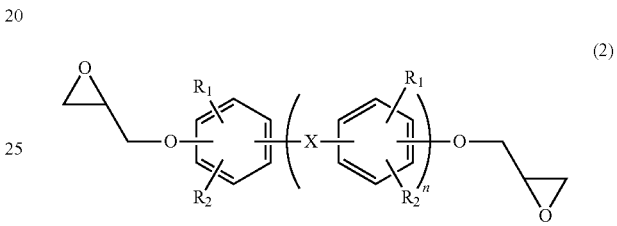

with a bisphenol compound represented by the following general formula (3):

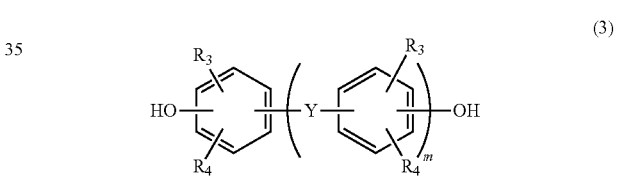

in general formula (2), X, $R_1$, $R_2$, and n are as defined in general formula (1); in general formula (3), m is a number of 1 to 3, $R_3$ and $R_4$ each is a hydrogen atom, an alkyl group of 1 to 8 carbon atoms, an aryl group, an alkoxy group, an aralkyl group, or a halogen atom, Y is a direct bond, an oxygen atom, a sulfur atom, —SO—, —SO$_2$—, —CO—, —CH$_2$—, —CH(CH$_3$)—, —C(CH$_3$)$_2$—, —CH$_2$-φ-CH$_2$—, —CH(CH$_3$)-φ-CH(CH$_3$)—, —C(CH$_3$)$_2$-φ-C(CH$_3$)$_2$—, —CH$_2$-φ-φ-CH$_2$—, —CH(CH$_3$)-φ-φ-CH(CH$_3$)—, —C(CH$_3$)$_2$-φ-φ-C(CH$_3$)$_2$—, or a 9,9-fluorenyl group, and φ is a phenylene group.

2) A method which comprises reacting a diglycidyl compound represented by the following general formula (4)

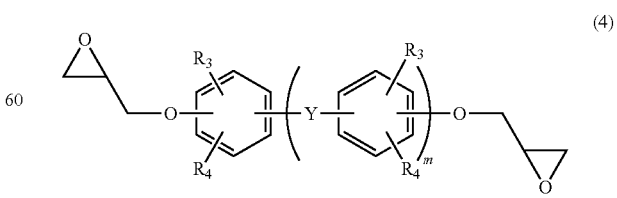

with a bisphenol compound represented by the following general formula (5):

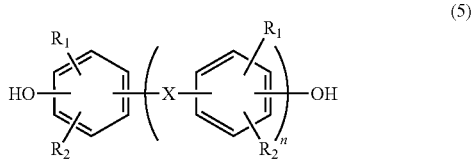

(5)

in general formula (4), m, $R_3$, $R_4$, and Y are as defined in general formula (3); in general formula (5), X, $R_1$, $R_2$, and n are as defined in general formula (2).

3) A method which comprises reacting a bisphenol compound represented by the aforementioned general formula (5) with epichlorohydrin in the presence of an alkali metal hydroxide.

The aforementioned aromatic ether polymers preferably satisfy one or more of the following conditions.
a) In formula (1), the benzene ring has a 1,4-phenylene structure, $R_1$ and $R_2$ each is a hydrogen atom, and n is 1.
b) The polymers are in the crystallized state.
c) The polymers have a melting point in the range of 100 to 250° C.
d) The polymers have a heat of fusion of 10 J/g or more.

This invention further relates to a resin composition comprising the aforementioned aromatic ether polymer. Still further, this invention relates to a cured resin product obtained by curing the aforementioned resin composition. The aromatic ether polymer is preferably a phenoxy resin.

PREFERRED EMBODIMENTS OF THE INVENTION

Figure 1:
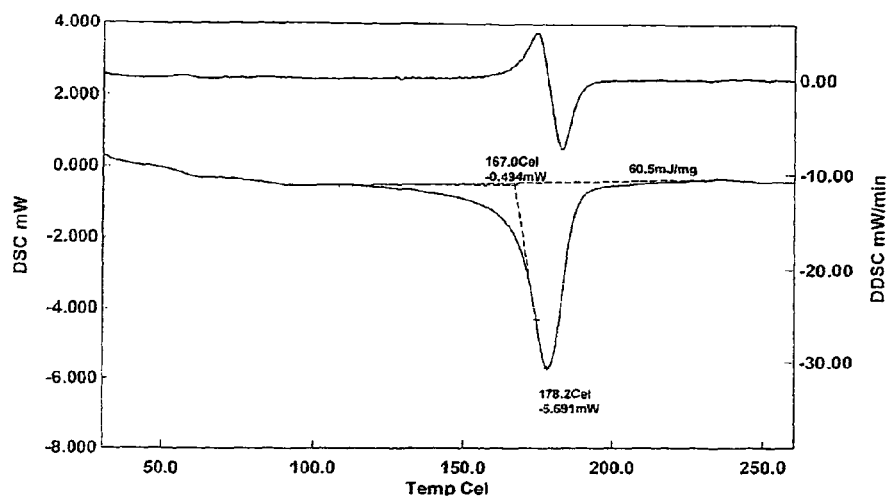
FIG. 1 is a DSC chart of polymer A.

The aromatic ether polymer of this invention (may hereinafter simply be referred to as the polymer) comprises the unit represented by general formula (1) at a ratio of 10 to 100 mol %, preferably 40 to 100 mol %, more preferably 60 to 100 mol %. When the ratio is outside the lower limit, the effects of this invention, that is, low thermal expansion and high thermal conductivity, become difficult to achieve. The linking group X in general formula (1) is oxygen or sulfur and oxygen is preferred to sulfur as crystallization occurs more easily when X is oxygen.

The polymer of this invention may contain units other than the one represented by general formula (1), for example, a unit represented by the following general formula (6)

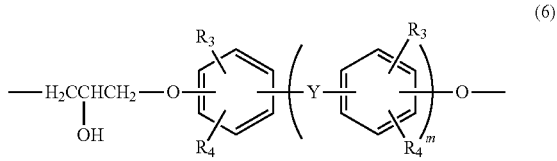

(6)

wherein m, $R_3$, $R_4$, and Y are as defined in general formula (3). Of these units, a unit represented by general formula (6) wherein Y is an oxygen atom, a sulfur atom, a direct bond, or a methylene group is suitable for facilitating crystallization of the polymer. This unit may exist in the range of 0 to 90 mol %, preferably 0 to 60 mol %, and more preferably 0 to 40 mol %.

The polymer of this invention has a weight average molecular weight of 3,000 or more. When a resin composition comprising the polymer having a molecular weight of less than 3,000 is applied to a substrate such as a copper foil, a SUS foil, a polyethylene terephthalate film, a polyimide film, or a glass plate and dried, there may arise problems such as curling of the substrate or powder drop-off during cutting of the substrate. On the other hand, a resin composition comprising the polymer having a molecular weight in excess of 200,000, even when dissolved in a solvent to a concentration in the range of 40 to 70 wt % that is commonly used in the industry, yields a solution that is too high in viscosity to be applied readily to a substrate. For this reason, the weight average molecular weight of the polymer of this invention is preferably 5,000 to 100,000, more preferably 10,000 to 60,000.

The polymer of this invention may not be crystallized as it can assume the condition of amorphous glass when supercooled, but it is preferably partly crystallized. When crystallized, the polymer shows a melting point preferably in the range of 100 to 250° C. in terms of the endothermic peak determined with a DTA apparatus at a rate of temperature rise of 10° C./min. When the melting point is below the lower limit, the properties of high heat resistance, low thermal expansion, and high gas barrier property due to crystallinity deteriorate. On the other hand, ease of handling of the polymer is affected adversely when the melting point is above the upper limit. The degree of crystallization may be grasped by DTA and the heat of fusion corresponding to the endothermic peak in DTA is preferably 10 J/g or more, more preferably 20 J/g or more, most preferably 40 J/g or more. When the heat of fusion is lower than this, the properties of heat resistance, thermal expansion, and gas barrier property due to crystallinity deteriorate.

The polymer of this invention can be crystallized generally by annealing at a temperature below its melting point. The annealing is generally conducted at a temperature that is lower than the melting point by 10 to 100° C. for a period ranging from 5 minutes to 12 hours. In some cases, the crystallization may be effected by addition of a solvent or a low-molecular-weight epoxy resin.

The terminal groups of the polymer of this invention include epoxy, hydroxyl, carboxyl, vinyl, and aromatic groups, the epoxy group being preferred.

The polymer of this invention is generally produced either by the direct reaction of a dihydroxy phenol with epichlorohydrin or by the addition polymerization reaction of a diglycidyl ether with a dihydroxy phenol. Either of the methods may be used in this invention.

In the direct reaction of a dihydroxy phenol with epichlorohydrin, a bisphenol compound represented by general formula (5) is used as a dihydroxy phenol. In this case, it is necessary that a bisphenol compound represented by general formula (5) wherein X is an oxygen atom or a sulfur atom accounts for 10 mol % or more of the total dihydroxy phenols in use. When the bisphenol compound in question is less than 10 mol %, the effect of the phenyl ether skeleton thereby introduced is not sufficient and it is not possible to obtain a cured product exhibiting high heat resistance, high thermal conductivity, low thermal expansion, high toughness, and high gas barrier property.

In the addition polymerization reaction of a diglycidyl ether with a dihydroxy phenol, a dihydroxy phenol represented by general formula (3) or (5) is reacted with a diglycidyl ether represented by general formula (2) or (4). In this case, it is essential to use at least one kind of dihydroxy phenols represented by general formula (5) or diglycidyl ethers represented by general formula (2).

In general formulas (1) to (5), $R_1$, $R_2$, $R_3$, and $R_4$ each is independently a substituent selected from a hydrogen atom, an alkyl group of 1 to 8 carbon atoms, an aryl group, an alkoxy group, an aralkyl group, and a halogen atom and is preferably a hydrogen atom or a methyl group. The reactivity of the hydroxyl group drops when the carbon atoms at the α-position in $R_1$, $R_2$, $R_3$, and $R_4$ are simultaneously secondary or tertiary, which is undesirable. In general formulas (1) to (5), the linking sites on the benzene ring may be the 1,4-, 1,3-, and 1,2-positions and the 1,4-position is particularly desirable. When the linking site is the 1,3- or 1,2-position, the resulting polymer shows lower crystallinity and fails to produce the expected effects of lowering thermal expansion and improving gas barrier property due to crystallinity.

The preferable dihydroxy phenols represented by general formula (5) include 4,4'-dihydroxydiphenyl ether, 1,4-bis(4-hydroxyphenoxy)benzene, 1,3-bis(4-hydroxyphenoxy)benzene, 4,4'-bis(4-hydroxyphenoxy)diphenyl ether, and 4,4'-dihydroxydiphenyl sulfide and 4,4'-dihydroxydiphenyl ether is preferred.

In the production of the polymer by the addition polymerization reaction of a diglycidyl ether with a dihydroxy phenol, a diglycidyl ether represented by general formula (2) is reacted with a dihydroxy phenol represented by general formula (3) or a diglycidyl ether represented by general formula (4) is reacted with a dihydroxy phenol represented by general formula (5). The reaction can be carried out in the presence of a catalyst based on an amine, an imidazole, triphenylphosphine, or a phosphonium salt. The molar ratio of diglycidyl ether to dihydroxy phenol is normally in the range of 3:1 to 1:3, preferably 2:1 to 1:2, more preferably 1.1:1 to 1:1.1. The closer the molar ratio to 1, the higher becomes the molecular weight of the resulting polymer.

Although the diglycidyl ether and the dihydroxy phenol in the aforementioned reaction may respectively be a mixture of two kinds or more, these two reactants must be selected so that the unit represented by general formula (1) accounts for 10 mol % or more of the product polymer. When the unit in question accounts for less than 10 mol %, the phenyl ether skeleton thereby introduced does not produce the anticipated effect sufficiently and it becomes impossible to obtain a cured product exhibiting high heat resistance, low thermal expansion, high thermal conductivity, and high toughness.

The dihydroxy phenol represented by general formula (3) is construed to be identical with the dihydroxy phenol represented by general formula (5) or the diglycidyl ether represented by general formula (4) is construed to be identical with the diglycidyl ether represented by general formula (2) in the case where Y in general formula (3) or (4) is oxygen or sulfur since $R_3$ and $R_4$ are defined to mean the same as $R_1$ and $R_2$; that is, the dihydroxy phenol represented by general formula (3) or the diglycidyl ether represented by general formula (4) yields the unit represented by general formula (1) in this case. The unit represented by general formula (6) is formed where Y is other than oxygen or sulfur.

A resin composition comprising the polymer of this invention whose weight average molecular weight is 5,000 or more shows poor flow during molding by itself and often lacks a sufficient ability to embed the circuit. In this case, another low-molecular-weight epoxy resin may be added to provide a satisfactory embedding ability. The weight average molecular weight of such epoxy resins is 3,000 or less, preferably 1,500 or less, more preferably 800 or less.

In formulating a resin composition in the aforementioned case, the ratio of the polymer of this invention to the low-molecular-weight epoxy resin is 100 parts by weight of the former to 10 to 90 parts by weight, preferably 20 to 60 parts by weight, of the latter. The resin composition shows poor flow during molding when less than 10 parts by weight of the low-molecular-weight epoxy resin is added or the cured product deteriorates in heat resistance and moisture resistance when more than 90 parts by weight of the low-molecular-weight epoxy resin is added.

Epoxy resins that are aromatic and have an epoxy equivalent in the range of 100 to 2,000 g/equiv are useful as the aforementioned low-molecular-weight epoxy resin for providing a sufficient circuit-embedding ability without deteriorating the properties such as flexibility and heat resistance after curing. A resin having an epoxy equivalent in excess of 2,000 g/equiv does not sufficiently embed the circuit and, besides, the crosslinking density drops and a cured film of desired heat resistance is not obtained. An aliphatic epoxy resin attains sufficient embedding of the circuit, but yields a cured film of low heat resistance. When the resin in use has an epoxy equivalent of less than 100 g/equiv, the cured product shows enhanced crosslinking density and large shrinkage, suffers an excessive change in shape, and absorbs more moisture. Under such circumstances, the epoxy equivalent of low molecular-weight epoxy resin is preferably 130 to 1,500 g/equiv, more preferably 150 to 1,000 g/equiv. The epoxy resins produced by the reaction of a dihydroxy phenol represented by the aforementioned general formula (3) with epichlorohydrin are preferred and they include, although they are not particularly limited to, bisphenol A type epoxy resins, bisphenol F type epoxy resins, tetramethylbisphenol F type epoxy resins, and tetrabromobisphenol A type epoxy resins. These epoxy resins may be used singly or as a mixture of two kinds or more.

On the contrary, the cured product of a resin composition of this invention shows poorer film-forming property and lower flexibility when the polymer of this invention incorporated in the composition has a molecular weight of 5,000 or less. In this case, another high-molecular-weight epoxy resin (that is, an epoxy resin having a higher Mw than the polymer of this invention) may be added to provide good film-forming property.

The addition here is made at a rate of preferably 10 to 90 parts by weight, more preferably 20 to 60 parts by weight, of the high-molecular-weight epoxy resin to 100 parts by weight of the sum of the polymer of this invention and the high-molecular-weight epoxy resin. The cured product is formed into film with more difficulty when less than 10 parts by weight of the high-molecular weight epoxy resin is added or the cured product deteriorates in heat resistance, thermal expansion, and thermal conductivity when more than 90 parts by weight of the high-molecular-weight epoxy resin is added.

The aforementioned high-molecular-weight epoxy resins preferably have a weight average molecular weight of 5,000 to 100,000, more preferably 10,000 to 60,000, and they include, although they are not particularly limited to, bisphenol A type epoxy resins, bisphenol F type epoxy resins, tetramethylbisphenol F type epoxy resins, and tetrabromobisphenol A type epoxy resins.

The resin composition of this invention advantageously comprises an epoxy resin, a phenoxy resin, or a compound containing an epoxy group. The polymer of this invention can serve as such resin. In the case where the resin composition of this invention comprises an epoxy resin or a compound containing an epoxy group, it is desirable to use a curing agent.

All of the generally known curing agents can be used and their examples include the following curing agents that are commonly used for epoxy resins but are not limited thereto: dicyandiamide and its derivatives, imidazole derivatives such as 2-methylimidazole and 2-ethyl-4-methylimidazole, dihydroxy phenols such as bisphenol A, bisphenol F, brominated bisphenol A, naphthalenediol, and dihydroxybiphenyl, novolak type phenolic resins obtained by the condensation reaction of a phenol such as phenol, cresol, bisphenol A, naphthol, and naphthalenediol with an aldehyde or keone such as formaldehyde, aralkyl type phenolic resins obtained by the condensation reaction of a phenol such as phenol, cresol, bisphenol A, naphthol, and naphthalenediol with xylyleneglycol, acid anhydrides such as phthalic anhydride, trimellitic anhydride, pyromellitic anhydride, maleic anhydride, and hexahydrophthalic anhydride, amines such as diaminodiphenylmethane, triethylenetetramine, isophoronediamine, and polyamideamines obtained by the condensation reaction of an acid such as dimer acid with a polyamine, and hydrazides such as adipic acid dihydrazide and isophthalic acid dihydrazide. These curing agents may be used singly or as a mixture of two kinds or more.

In application of a resin composition in this invention, advantageously an epoxy resin composition, to a substrate, a solvent may be used to maintain the composition at a suitable level of viscosity. The solvents for adjusting the viscosity should not remain behind in the epoxy resin composition after the solvent is dried off at 80 to 200° C. and such solvents include, although they are not limited to, toluene, xylene, methyl ethyl ketone, methyl isobutyl ketone, dioxane, ethanol, isopropyl alcohol, Methyl Cellosolve, Ethyl Cellosolve, cyclohexanone, N,N-dimethylformamide, N,N-dimethylacetamide, and dimethyl sulfoxide. These solvents may be used singly or as a mixture of two kinds or more.

It is allowable to add silica, calcium carbonate, talc, aluminum hydroxide, mica, alumina, or aluminum nitride to provide the composition of this invention with improved heat resistance and fire retardance, low thermal expansion property, and high thermal conductivity or add an epoxysilane coupling agent or rubber to improve the adhesive strength of the composition to the extent that such addition does not deteriorate the properties of the cured product.

A curing accelerator may be added to the resin composition of this invention if necessary. Examples include, but they are not limited to, a variety of known curing accelerators based on amines, imidazoles, triphenylphosphine, and phosphonium salts. When a curing accelerator is used, it is added preferably in the range of 0.01 to 10 wt % on the basis of the resin components (that is, the sum of the polymer of this invention and other resins added). Addition in excess of 10 wt % is undesirable as there is the possibility of the storage stability deteriorating.

In the case where the resin composition of this invention is an epoxy resin composition, the composition is cured by dissolving the composition in one of the aforementioned solvents to a viscosity of 15 Pa·s or less, preferably 10 Pa·s or less, adding a suitable curing agent to the solution in such an amount as to provide a certain curing time, adding further a curing accelerator if necessary, applying the resulting varnish to a substrate, evaporating the solvent at 100 to 160° C. to form a prepreg, and curing the prepreg by heating.

EXAMPLES

This invention will be described concretely below with reference to the examples.

Example 1

Figure 2:
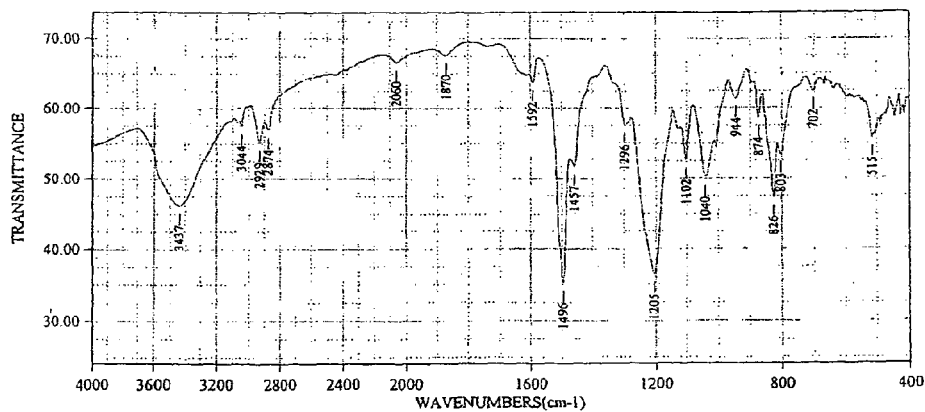
FIG. 2 is an infrared absorption spectrum of polymer A.

In a 500-ml glass separable flask equipped with a stirrer, a thermometer, and a nitrogen gas inlet were placed 161.0 parts of 4,4'-(bisglycidyloxy)diphenyl ether (YSLV-80DE having an epoxy equivalent of 161 g/equiv, a product of Tohto Kasei Co., Ltd.), 99.0 parts of 4,4'-dihydroxydiphenyl ether, and 260 parts of cyclohexanone, the mixture was heated to 100° C. with stirring in a nitrogen atmosphere to form a solution, 0.05 part of 2-ethyl-4-methylimidazole was added as a catalyst to the solution, and the reaction was carried out at 160° C. for 5 hours to give a polymer solution. The solution was added in drops to a large amount of methanol and 241 g of a white polymer (polymer A) was recovered. The polymer showed a reduced viscosity of 0.76 when measured at 30° C. using N-methylpyrrolidone as a solvent. The DSC chart of the polymer determined with a DTA apparatus at a rate of temperature rise of 10° C./min is shown in FIG. 1. The peak for melting point was observed at 178.2° C. and the heat of fusion was 60.5 mJ/mg. The infrared absorption spectrum is shown in FIG. 2.

Example 2

Figure 3:
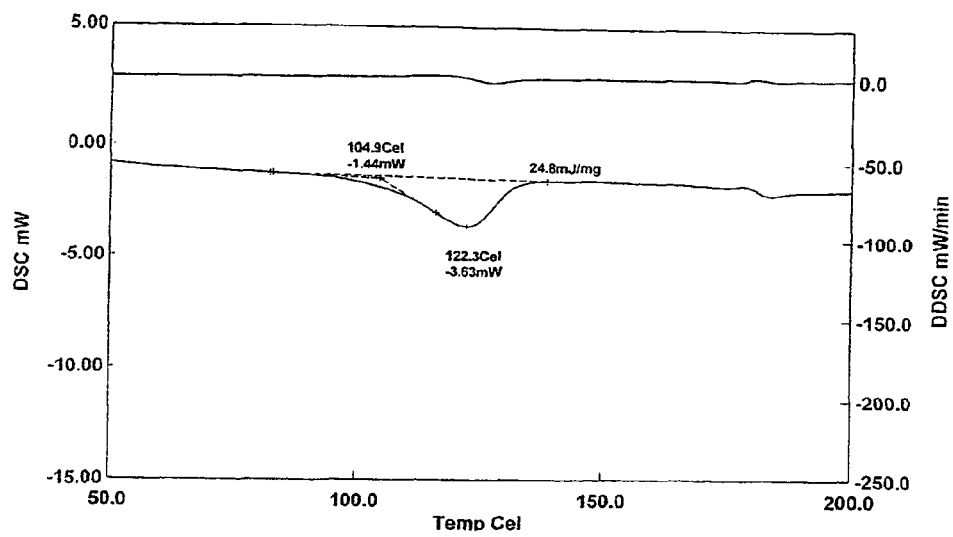
FIG. 3 is a DSC chart of polymer B.
Figure 4:
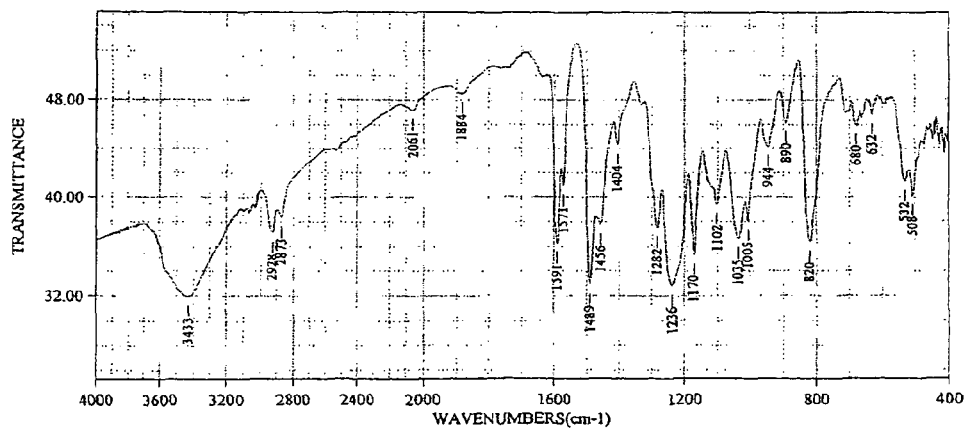
FIG. 4 is an infrared absorption spectrum of polymer B.

The reaction was carried out as in Example 1 with the exception of using 170.0 parts of 4,4'-(bisglydidyloxy)diphenyl sulfide (YSLV-50TE having an epoxy equivalent of 170 g/equiv, a product of Tohto Kasei Co., Ltd.) in place of 4,4'-(bisglycidyloxy)diphenyl ether and 106.8 parts of 4,4'-dihydroxydiphenyl sulfide in place of 4,4'-dihydroxydiphenyl ether to give 257 parts of a polymer (polymer B). The polymer showed a reduced viscosity of 0.54 when measured at 30° C. using N-methylpyrrolidone as a solvent. The DSC chart of the polymer determined with a DTA apparatus at a rate of temperature rise of 10° C./min is shown in FIG. 3. The peak for melting point was observed at 122.3° C. and the heat of fusion was 24.8 mJ/mg. The infrared absorption spectrum is shown in FIG. 4.

Example 3

In a 500-ml four-necked separable flask equipped with a stirrer, a thermometer, a condenser, and a nitrogen inlet were placed 245 parts of 4,4'-(bisglycidyloxy)diphenyl ether (YSLV-80DE having an epoxy equivalent of 161 g/equiv, a product of Tohto Kasei Co., Ltd.) and 38 parts of 4,4'-dihydroxydiphenyl ether, the mixture was melted and mixed with stirring at 150° C. in a nitrogen atmosphere, 0.12 part of triphenylphosphine was added, and the reaction was carried out for 2 hours to give 281 parts of a diglycidyl resin. The diglycidyl resin (diglycidyl resin A) crystallized when left to cool at room temperature. The diglycidyl resin thus obtained showed an epoxy equivalent of 261 g/equiv, a melting point of 100 to 122° C. when measured by the capillary method, and a viscosity of 0.037 Pa·s at 150° C. The ratio of respective fractions in general formula (1) was determined by GPC of the resin as follows: n=0, 45.8%; n=2, 28.0%, n=4, 12.3%, and n≥6, 13.9%. The viscosity was measured with Contraves Rheomat 115. The GPC measurements were made under the following conditions: apparatus, HLC-82A manufactured by Tosoh Corporation; columns, TSK-GEL2000×3 and TSK-GEL4000×1, manufactured by Tosoh Corporation; solvent, tetrahydrofuran; flow rate, 1 ml/min; temperature, 38° C.; detector, refractive index.

The reaction of 151.7 parts of the diglycidyl resin obtained above with 53.4 parts of 4,4'-dihydroxydiphenyl ether was carried out according to the same procedure as in Example 1 to give 202 parts of a white crystalline polymer (polymer C). The polymer showed a reduced viscosity of 0.59 when measured at 30° C. using N-methylpyrrolidone as a solvent, a weight average molecular weight of 35,710 and a number average molecular weight of 6,210 when determined by GPC. In a DSC analysis, the peak for melting point was observed at 181.4° C. and the heat of fusion was 42.0 J/g.

Example 4

The reaction was carried out as in Example 1 with the exception of using 93 parts of 4,4'-dihydroxybiphenyl in place of 4,4'-dihydroxydiphenyl ether to give 251 parts of a polymer. The polymer showed a reduced viscosity of 0.61 when measured at 30° C. using N-methylpyrrolidone as a solvent, an endothermic peak of 242.5° C. resulting from melting of crystals, and an amount of absorbed heat of 50.2 J/g.

Example 5

The reaction was carried out as in Example 1 with the exception of using 100.0 parts of 4,4'-dihydroxydiphenyl-methane in place of 4,4'-dihydroxydiphenyl ether to give 257 parts of a polymer. The polymer showed a reduced viscosity of 0.48 when measured at 30° C. using N-methylpyrrolidone as a solvent, an endothermic peak of 142.5° C. resulting from melting of crystals, and an amount of absorbed heat of 20.4 J/g.

Examples 6 and 7 and Comparative Example 1

A varnish with a solid content of 30 wt % was prepared respectively from polymer A obtained in Example 1, polymer B obtained in Example 2, and polymer D (YP-50, a bisphenol A type phenoxy resin having a weight average molecular weight of 70,000, a product of Tohto Kasei Co., Ltd.) and the varnish was applied to a polyethylene terephthalate film and dried to give a 30 μm-thick polymer film. The film was measured for glass transition temperature and linear expansion coefficient and the results are shown in Table 1.

The glass transition temperature and linear expansion coefficient were determined with a thermomechanical analyzer at a rate of temperature rise of 10° C./min.

TABLE 1

| | | Example 4 | Example 5 | Comparative example 1 |
|---|---|---|---|---|
| Polymer | | A | B | D |
| Appearance of film | | Opaque | Somewhat opaque | Transparent |
| Melting point (° C.) | | 178.2 | 122.3 | None |
| Heat of fusion (j/g) | | 60.5 | 24.8 | 0 |
| Glass transition temperature (° C.) | | 94 | 82 | 98 |
| Linear expansion coefficient (<Tg, × $10^{-5}$) | | 51 | 59 | 76 |
| Elongation (%) | 30° C.-100° C. | 0.3 | 3.0 | 3.7 |
| | 30° C.-125° C. | 0.6 | 12.2 | >35[1)] |
| | 30° C.-150° C. | 1.0 | 13.4 | >35[1)] |

[1)]Elongation over the limit of measurement

INDUSTRIAL APPLICABILITY

The polymer of this invention is crystalline and has a melting point of 100° C. or above and the cured product thereof is expected to exhibit high heat resistance, high thermal conductivity, low thermal expansion, high gas barrier property, and high toughness and can be used as a cured epoxy resin in the form of film or sheet in such applications as multilayer printed wiring boards, adhesives, and coating materials.

What is claimed is:

1. A crystalline structure comprising a thermoplastic aromatic ether polymer comprising a unit represented by the following general formula (1) at a concentration of 10 to 100 mol % and having a weight average molecular weight of 10,000 to 60,000;

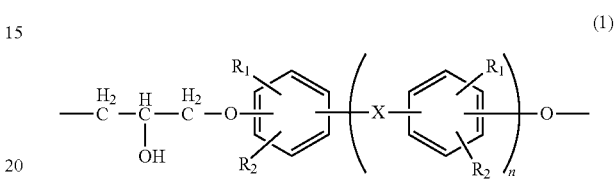

(1)

in formula (1), X is oxygen atom or sulfur atom, $R_1$ and $R_2$ are hydrogen atoms, and n is 1,
  wherein the benzene rings along the polymer backbone have a 1,4-phenylene structure,
  wherein at least one of the terminal groups of the aromatic ether polymer is a hydroxyl group, and
  wherein the polymer is in the crystallized state.

2. A method for producing the crystalline structure described in claim 1 which comprises reacting a diglycidyl compound represented by the following general formula (2)

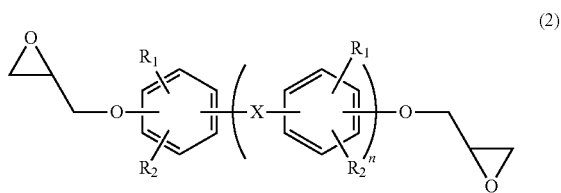

(2)

with a bisphenol compound represented by general formula (3):

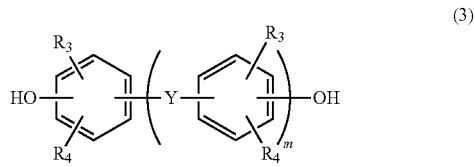

(3)

in general formula (2), X, $R_1$, $R_2$, and n are as defined in general formula (1); in general formula (3), m is a number of 1 to 3, $R_3$ and $R_4$ each is hydrogen atom, alkyl group of 1 to 8 carbon atoms, aryl group, alkoxy group, aralkyl group, or halogen atom, Y is direct bond, oxygen atom, sulfur atom, —SO—, —SO$_2$—, —CO—, —CH$_2$—, —CH(CH$_3$)—, —C(CH$_3$)$_2$—, —CH$_2$-ϕ-CH$_2$—, —CH(CH$_3$)-ϕ-CH(CH$_3$)—, —C(CH$_3$)$_2$-ϕ-C(CH$_3$)$_2$—, —CH$_2$-ϕ-ϕ-CH$_2$—, —CH(CH$_3$)-ϕ-ϕ-CH(CH$_3$)—, —C(CH$_3$)$_2$-ϕ-ϕ-C(CH$_3$)$_2$—, or 9,9-fluorenyl group, and ϕ is phenylene group.

3. A method for producing the crystalline structure described in claim 1 which comprises reacting a diglycidyl compound represented by the following general formula (4)

(4)

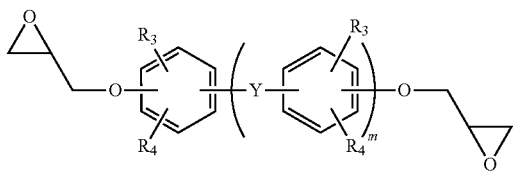

with a bisphenol compound represented by the following general formula (5):

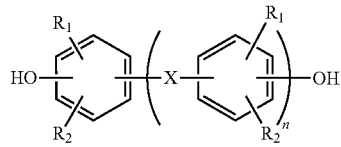
(5)

in general formula (4), m is a number of 1 to 3, $R_3$ and $R_4$ each is hydrogen atom, alkyl group of 1 to 8 carbon atoms, aryl group, an alkoxy group, aralkyl group, or halogen atom, Y is direct bond, oxygen atom, sulfur atom, —SO—, —SO$_2$—, —CO—, —CH$_2$—, —CH(CH$_3$)—, —C(CH$_3$)$_2$—, —CH$_2$-φ-CH$_2$—, —CH(CH$_3$)-φ-CH(CH$_3$)—, —C(CH$_3$)$_2$-φ-C(CH$_3$)$_2$—, —CH$_2$-φ-φ-CH$_2$—, —CH(CH$_3$)-φ-φ-CH(CH$_3$)—, or 9,9-fluorenyl group, and φ is phenylene group; in general formula (5), X is oxygen atom or sulfur atom, $R_1$ and $R_2$ are hydrogen atoms, and n is 1.

4. A method for producing the crystalline structure described in claim 1 which comprises reacting a bisphenol compound represented by the following general formula (5)

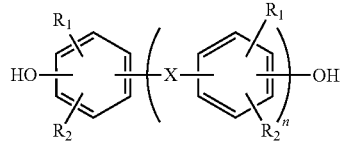
(5)

with epichlorohydrin in the presence of an alkali metal hydroxide;
in general formula (5), X is oxygen atom or sulfur atom, $R_1$ and $R_2$ are hydrogen atoms, and n is 1.

5. The crystalline structure as described in claim 1, wherein the polymer has a melting point in the range of 100° C. to 250° C.

6. The crystalline structure as described in claim 1, wherein the polymer shows a heat of fusion of 10 J/g or more.

7. A resin composition comprising the crystalline structure described in any one of claims 1, 5, and 6.

8. A cured resin composition obtained by curing the resin composition described in claim 7.

9. A crystalline structure comprising a thermoplastic aromatic ether polymer comprising a unit represented by the following general formula (1) at a concentration of 10 to 100 mol % and having a weight average molecular weight of 3,000 or more;

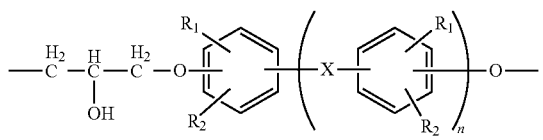
(1)

in formula (1), X is oxygen atom or sulfur atom, $R_1$ and $R_2$ are hydrogen atoms, and n is 1,
wherein the benzene rings along the polymer backbone have a 1,4-phenylene structure,
wherein at least one of the terminal groups of the aromatic ether polymer is a hydroxyl group,
wherein the polymer is in the crystallized state; and
wherein the crystalline structure is produced by:
reacting a diglycidyl compound represented by the following general formula (2):

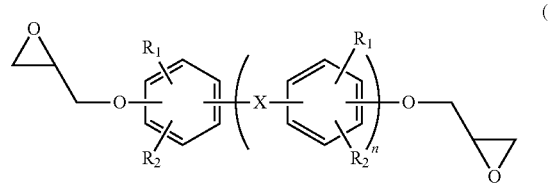
(2)

with a bisphenol compound represented by general formula (3):

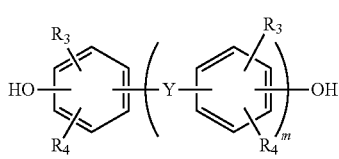
(3)

in general formula (2), X, $R_1$, $R_2$, and n are as defined in general formula (1);
in general formula (3), m is a number of 1 to 3, $R_3$ and $R_4$ each is hydrogen atom, alkyl group of 1 to 8 carbon atoms, aryl group, alkoxy group, aralkyl group, or halogen atom, Y is direct bond, oxygen atom, sulfur atom, —SO—, —SO$_2$—, —CO—, —CH$_2$—, —CH(CH$_3$)—, —C(CH$_3$)$_2$—, —CH$_2$-φ-CH$_2$—, —CH(CH$_3$)-φ-CH(CH$_3$)—, —C(CH$_3$)$_2$-φ-C(CH$_3$)$_2$—, —CH$_2$-φ-φ-CH$_2$—, —CH(CH$_3$)-φ-φ-CH(CH$_3$)—, —C(CH$_3$)$_2$-φ-φ-C(CH$_3$)$_2$—, or 9,9-fluorenyl group, and φ is phenylene group;
wherein a molar ratio of the diglycidyl compound to the bisphenol compound is 1.1:1 to 1:1.1.

* * * * *